(12) United States Patent
Chaudhry

(10) Patent No.: US 6,875,648 B1
(45) Date of Patent: Apr. 5, 2005

(54) FABRICATION OF AN EEPROM CELL WITH EMITTER-POLYSILICON SOURCE/DRAIN REGIONS

(75) Inventor: Muhammad I. Chaudhry, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/888,742

(22) Filed: Jul. 9, 2004

(51) Int. Cl.[7] .......................................... H01L 21/8238
(52) U.S. Cl. ........................ 438/202; 438/204; 438/217
(58) Field of Search ................................ 439/199–217, 439/309–350, 369–377

(56) References Cited

U.S. PATENT DOCUMENTS

2004/0051147 A1 * 3/2004 Panday et al. .............. 257/368

* cited by examiner

Primary Examiner—H. Jey Tsai
(74) Attorney, Agent, or Firm—Schneck & Schneck; Thomas Schneck

(57) ABSTRACT

An EEPROM memory cell uses an emitter polysilicon film for fabricating shallow source/drain regions to increase a breakdown voltage of the wells. The wells are fabricated to be approximately 100 nm (0.1 micrometers ($\mu$m)) in depth with a breakdown voltage of approximately 14 volts or more. A typical breakdown voltage of a well in a bipolar process is approximately 10 volts. Due to the increased breakdown voltage achieved, EEPROM memory cells can be produced along with bipolar devices on a single integrated circuit chip and fabricated on a common semiconductor fabrication line.

10 Claims, 5 Drawing Sheets

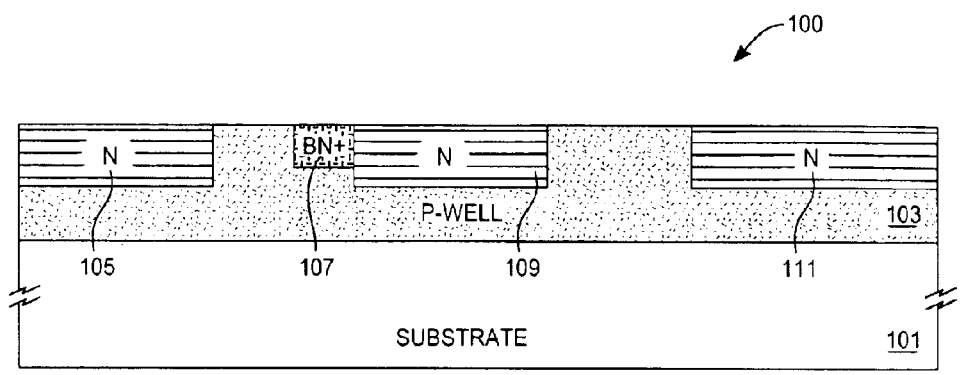
Fig._1
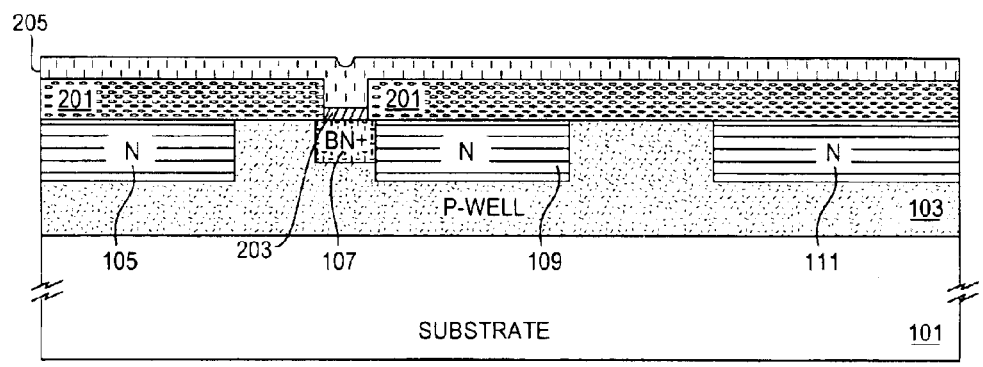
Fig._2

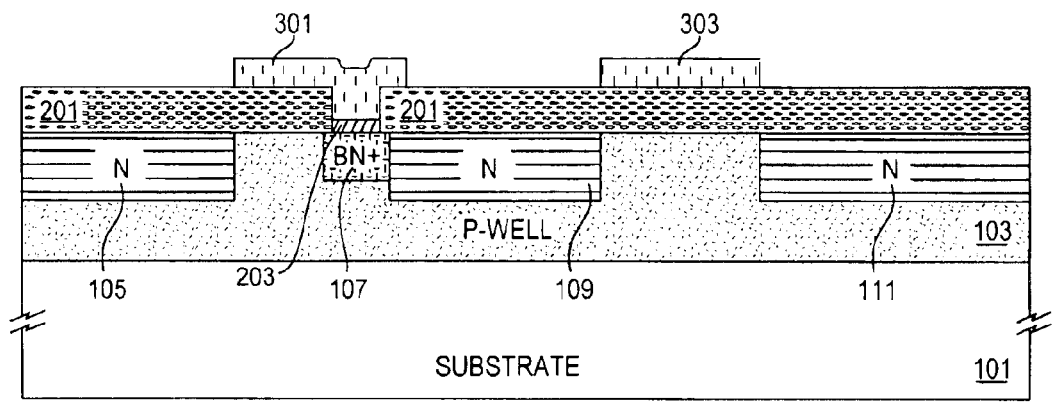
Fig._3
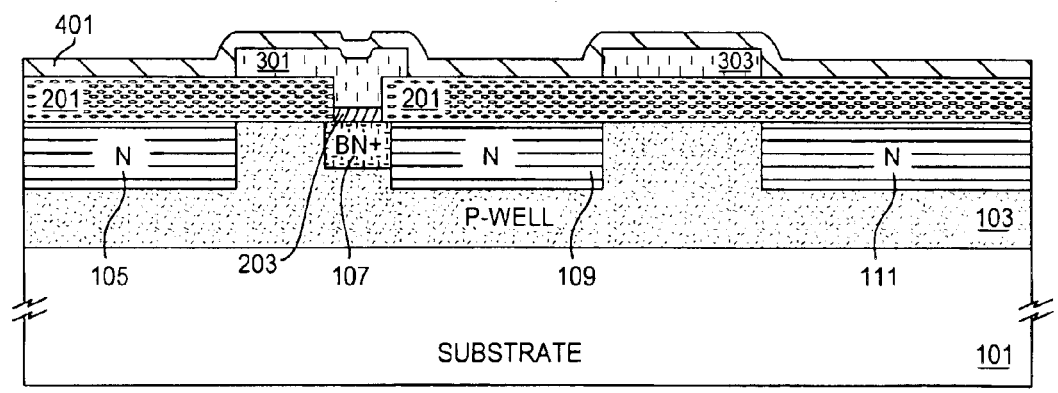
Fig._4

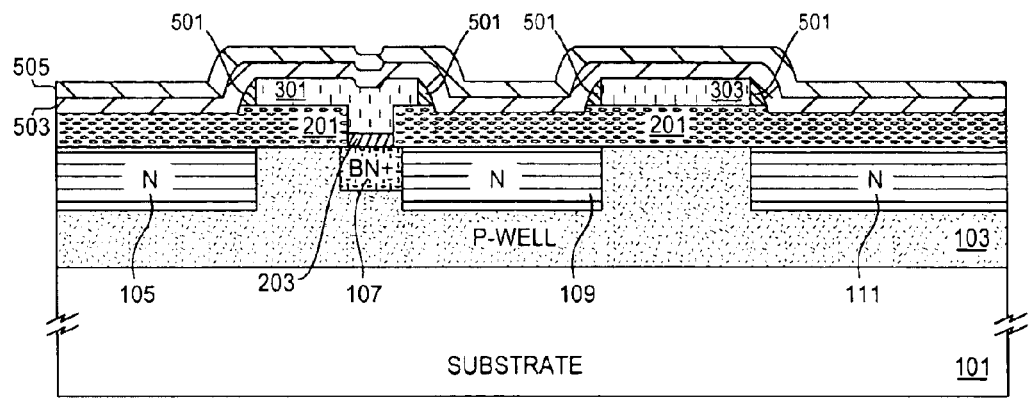
Fig._5
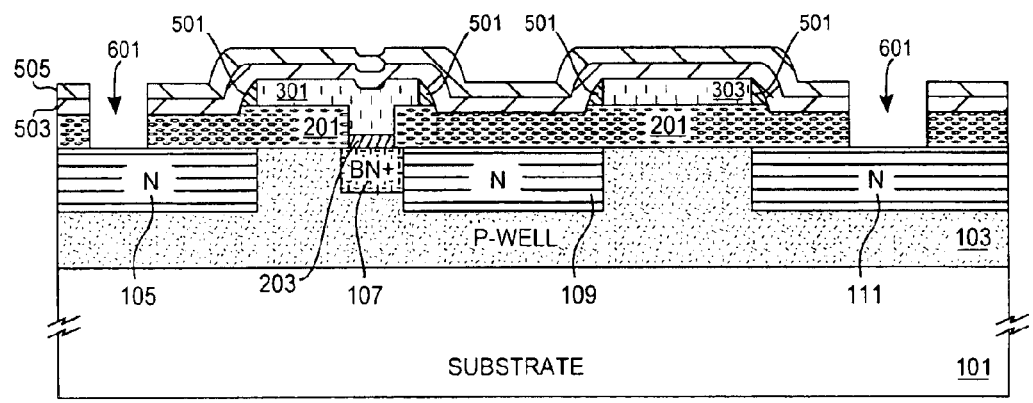
Fig._6

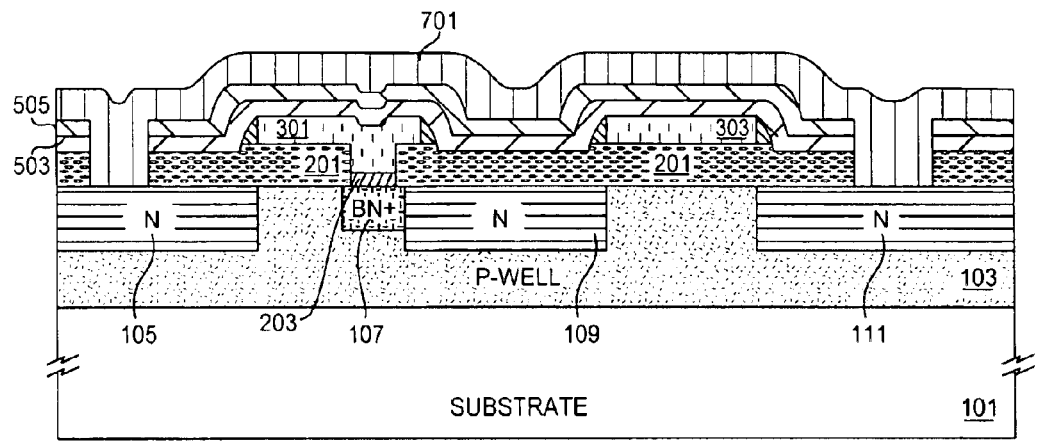
Fig._7
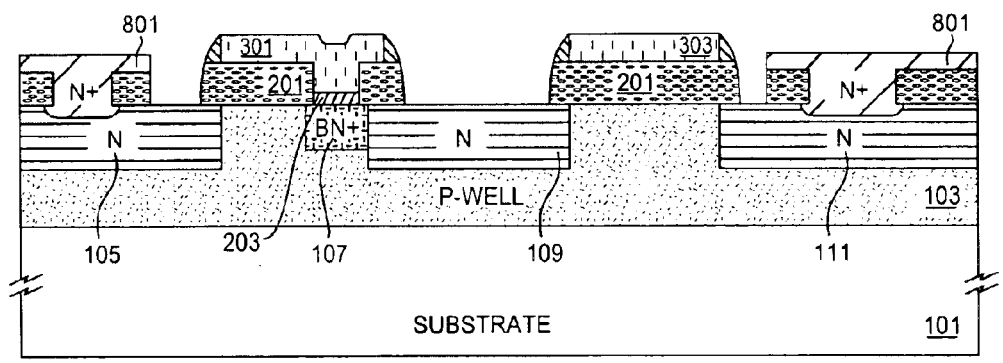
Fig._8

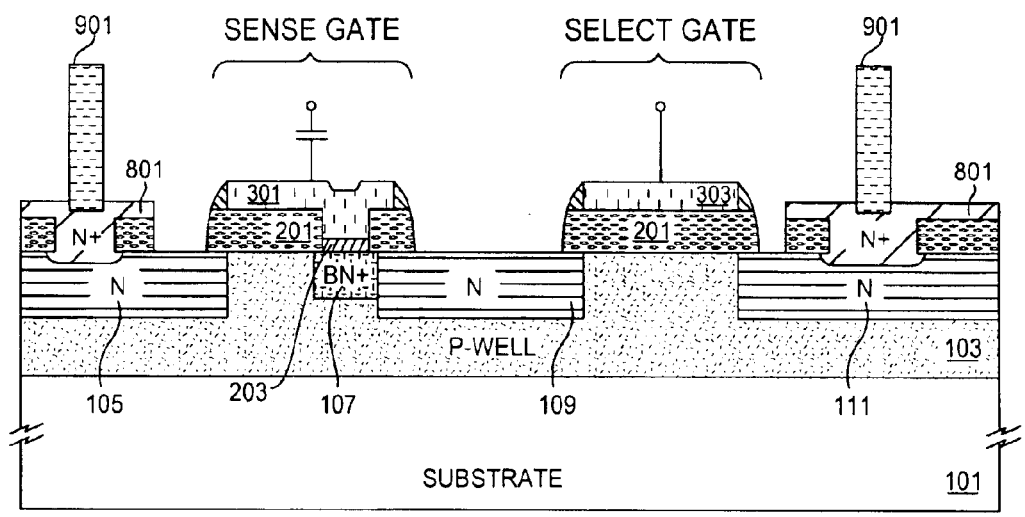
Fig._9

FABRICATION OF AN EEPROM CELL WITH EMITTER-POLYSILICON SOURCE/DRAIN REGIONS

TECHNICAL FIELD

A present invention described herein relates generally to a process for fabricating an integrated circuit structure, and more specifically to an electronic memory device and a process for manufacture.

BACKGROUND ART

Semiconductor memory devices are typically classified into volatile memory devices and non-volatile memory devices. Volatile memory devices are subdivided into dynamic random-access memories (DRAMs) and static random access memories (SRAMs). Non-volatile memory types include erasable programmable read-only memories (EPROMS) and electrically erasable programmable read-only memories (EEPROMs). EEPROMs are increasingly used in system programming that requires continuous update or auxiliary memory devices. Particularly, flash EEPROMs are advantageous as mass storage devices because their integration density is high compared with conventional EEPROMs.

Frequently, it would be convenient to be able to mix integrated circuit device types, such as EEPROMs and other memory devices, and bipolar integrated circuits, such as NPN transistors, onto a single integrated circuit chip. However, due to the inherently low breakdown voltage (approximately 10 volts) of typical wells used in BiCMOS technology and the need for a high programming voltage of an EEPROM memory device (approximately 14 volts), there has been no simple and economical way to integrate these two device types into a single integrated circuit. Previously, the problem has been avoided in the art by using additional masks to create high-voltage wells for EEPROMS.

DISCLOSURE OF THE INVENTION

The present invention relates to an EEPROM memory cell that uses an emitter polysilicon film for fabricating shallow doped regions, acting as source/drain regions for EEPROMs to increase a breakdown voltage of the EEPROM wells. The source/drain regions are fabricated to be approximately 100 nm (0.1 micrometers ($\mu$m)) in depth with a breakdown voltage of approximately 14 volts. Low breakdown voltages on conventional CMOS devices is due, in part, to a deep source/drain region (e.g., greater than 0.2 $\mu$m). Due to the increased breakdown voltage achieved with the present invention, EEPROM memory cells can be produced along with BiCMOS devices on a single integrated circuit chip and fabricated in the wells used for bipolar and CMOS devices.

The present invention is a method of fabricating an integrated circuit by producing a p-well into an uppermost surface, doping a first source dopant region and a first drain dopant region, and doping a combination drain/source dopant region. The well and doped regions are all fabricated within an uppermost surface of a semiconducting substrate. The first drain and first source dopant regions, and the first combination drain/source dopant region are all lightly doped donor sites. A portion of a gate region is also doped with the gate region having a higher concentration of donor sites than either of the drain or source dopant regions or the combination drain/source region. Polysilicon is then deposited over the first source dopant region and the first drain dopant region to form emitter polysilicon regions. The emitter polysilicon regions are fabricated with a higher donor concentration than either the drain or source dopant regions or the combination drain/source region. At least one NMOS transistor is fabricated from the first drain and combination drain/source dopant regions, and the NMOS transistor is configured to serve as a select transistor in a memory cell. At least one additional NMOS transistor is fabricated from the first source and combination drain/source dopant regions, with the additional NMOS transistor configured to serve as a memory transistor in the memory cell.

The present invention is also an electronic integrated circuit fabricated onto a single integrated circuit chip. The integrated circuit chip includes a first CMOS transistor configured to control an operation of a memory transistor, a second CMOS transistor configured to operate as a memory transistor and coupled to the first transistor, and at least one NPN transistor. The second CMOS transistor is configured to have a programming voltage of about 14 volts. The first CMOS transistor and the second CMOS transistor are configured to operate as an EEPROM cell. The NPN transistor is configured to have a breakdown voltage greater than or equal to the programming voltage of the second CMOS transistor (i.e., about 14 volts).

BRIEF DESCRIPTION OF THE DRAWINGS

FIG. 1 shows doped regions used to create electronic device structures of the present invention.

FIG. 2 shows a polysilicon film deposited over the dopant regions of FIG. 1.

FIG. 3 shows a memory transistor gate polysilicon area and a select transistor gate polysilicon area formed from the deposited polysilicon film of FIG. 2.

FIG. 4 shows a nitride film layer deposited over the etched layers of FIG. 3.

FIG. 5 shows etched nitride spacers and additional film layers deposited over the etched layers of FIG. 4.

FIG. 6 shows emitter windows opened in the film stack of FIG. 5.

FIG. 7 shows an emitter polysilicon film deposited into the emitter windows of FIG. 6 and onto surrounding regions.

FIG. 8 shows a cross-sectional EEPROM memory cell 800 after completion of major processing steps.

FIG. 9 shows contacts added to the cross-sectional EEPROM memory cell 800 of FIG. 8.

BEST MODE FOR CARRYING OUT THE INVENTION

An electronic memory device of the present invention has source/drain junctions with a relatively high breakdown voltage (e.g., about 14 volts or approximately 12–15 volts). The breakdown voltage of MOS devices on a typical BiCMOS process is only about 10 volts. A lower well breakdown voltage is attributed to a deep (e.g., approximately 200 nm or greater (0.2 $\mu$m)) source/drain doped region. Using an emitter polysilicon film of the present invention to fabricate source/drain regions of an MOS device results in shallow junctions (i.e., less than 0.1 $\mu$m) and a resulting higher breakdown voltage. Therefore, the high breakdown voltage allows the present invention to be fabricated in an integrated CMOS/Bipolar (i.e., BiCMOS) line, allowing CMOS, bipolar devices (e.g., an NPN transistor), and EEPROMs to be formed in an integrated circuit.

With reference to FIGS. 1–9, an exemplary embodiment of the present invention is described according to the following process steps. FIG. 1 includes a cross-section 100 of implanted dopant regions used to create electronic device structures such as an EEPROM cell and an NPN transistor. FIG. 1 further includes a base substrate 101, an implanted p-well 103, a lightly-doped memory transistor source implant 105, a memory transistor gate implant 107, a lightly-doped drain/source implant 109, and a lightly-doped select transistor drain implant 111. All implant regions are formed by processes well-known to one of skill in the art. Alternatively, the p-well 103 may be an epitaxial deposition layer with p-type doping.

The base substrate 101 is frequently a silicon wafer. In this embodiment, the silicon wafer contains a p-type dopant. Alternatively, another elemental group IV semiconductor or compound semiconductor (e.g., groups III–V or II–VI) may be selected for base substrate 101. For a p-type silicon base substrate 101, the epitaxial deposition layer forming the p-well 103 will also contain a p-type dopant. The memory transistor source implant 105 and the drain/source implant 109 are implanted with an n-type dopant and the memory transistor gate implant 107 is a buried n-type (n+). The memory transistor gate implant 107 is used to form a bottom plate of a coupling capacitor and a heavily-doped region for an overlying tunnel diode window (TDW), discussed in more detail with reference to FIG. 2, infra.

In a specific exemplary embodiment, the memory source implant 105, the memory gate implant 107, the drain/source implant 109, and the select drain implant 111 are all produced by an ion implantation step followed by a drive-in step (e.g., by rapid thermal annealing (RTA)) to have a junction depth of approximately 100 nm (0.1 $\mu$m).

FIG. 2 includes a cross-section of a film stack applied over the implanted dopant regions 100 of FIG. 1. The film stack includes a gate oxide layer 201, a tunnel diode window (TDW) 203, and a polysilicon layer 205. The gate oxide layer 201 is either thermally grown or deposited by chemical vapor deposition (CVD). After the gate oxide layer 201 growth or deposition, and prior to deposition of the polysilicon layer 205, an opening is made in the gate oxide layer 201 to form, inter alia, the TDW 203. The opening is made by applying a photoresist layer (not shown), photolithographically exposing the photoresist layer, and developing and etching the photoresist layer to form an etch mask for the TDW 203. Subsequently, the TDW 203 may be etched through various etching techniques, such as a wet etch (e.g., a hydrofluoric acid etch, such as contained in a standard buffered oxide etch, or orthophosphoric acid) or dry etch (e.g., reactive-ion etch (RIE)) techniques. A brief thermal oxidation step is performed to regrow a thin tunnel oxide of the TDW 203.

In a specific exemplary embodiment, the gate oxide layer 201 is thermally grown and is 18 nm–20 nm (180 Å–200 Å) thick and the oxide of the TDW 203 is 7 nm (70 Å) thick.

With reference to FIG. 3, the polysilicon layer 205 of FIG. 2 is patterned by exposing, developing, and etching an overlaying photoresist layer (not shown), and etching the polysilicon layer 205; techniques well known to one skilled in the art. After the etch, the polysilicon layer 205 forms a memory transistor gate polysilicon area 301 and a select transistor gate polysilicon area 303.

A nitride layer 401 is deposited (FIG. 4) over the memory transistor gate polysilicon area 301 and the select transistor gate polysilicon area 303. The nitride layer 401 is patterned and dry etched (e.g., by RIE) forming nitride spacers 501 (FIG. 5), surrounding the gate polysilicon areas 301, 303. Depending on a selectivity of an etchant chosen for use in the RIE process, there may be some over-etching of the nitride layer 401 and into the gate oxide layer 201. If the process contemplates integrated CMOS/Bipolar technologies, discussed supra, formation of the nitride spacers 501 ends the CMOS process steps.

FIG. 5, contemplates a beginning of the bipolar device formation process steps and begins with a deposition of a CVD oxide 503 and a second polysilicon layer 505. A photoresist layer (not shown) overlaying the CVD oxide 503 and the second polysilicon layer 505, is exposed, developed, and etched. The etched photoresist layer serves as an etch mask for etching the CVD oxide 503 and the second polysilicon layer 505, producing an emitter window 601 (FIG. 6).

With reference to FIG. 7, an emitter polysilicon film 701 is deposited into the emitter windows of FIG. 6 (i.e., over the memory transistor source implant 105 and the select transistor drain implant 111 (FIG. 1)) and onto surrounding regions. The emitter polysilicon film 701 is doped, for example, with arsenic (forming an N+material), followed by applying an additional photoresist layer (not shown). Photolithographic exposure, develop, and etch of the photoresist and underlying emitter polysilicon film 701 produces, inter alia, the source/drain contact regions 801 (FIG. 8) for the memory and select devices.

With reference to FIG. 9, metallic contacts 901 are formed to couple to the source/drain contact regions. The metallic contacts 901 are formed by processes wellknown to a skilled artisan. The processes briefly involve, for example, depositing a CVD dielectric layer over the existing structures (e.g., as shown in FIG. 8), patterning and etching vias in the dielectric (one above each source/drain contact region 801), depositing a titanium nitride (TiN) or titanium (Ti) liner on interior walls of the via, and depositing a tungsten (W) or copper (Cu) plug within each lined via.

Metallization steps (not shown), known to one of skill in the art, will provide actual connection terminals in later process steps for the CMOS and bipolar devices. Following the completion of major processing steps referenced in FIG. 9, techniques well known to a skilled artisan are used to perform, for example, additional metallization, electronic-test, and packaging steps to complete the semiconductor memory cell device and one or more bipolar devices. Emitter poly deposition and patterning is also used to fabricate the emitter of the bipolar devices.

Although process steps and techniques are shown and described in some detail, a skilled artisan will recognize that other techniques and methods may be utilized which are still included within a scope of the appended claims. For example, there are frequently several techniques used for depositing a film layer (e.g., chemical vapor deposition, plasma-enhanced vapor deposition, epitaxy, atomic layer deposition, etc.). Although not all techniques are amenable to all film types described herein, one skilled in the art will recognize that multiple methods for depositing a given layer and/or film type may be used. Additionally, various techniques may be used to dope regions in a semiconductor. Although implantation has been described in the exemplary embodiments, one skilled in the art realizes that other doping procedures, such as diffusion, could be substituted or combined with the implantation procedures described herein. Further, the overall layout has been described in terms of horizontally-disposed CMOS and bipolar devices. However, a skilled artisan will recognize the present invention disclosed is readily applicable to a formation of a vertically-disposed devices as well. Therefore, a scope of the present invention shall only be limited by the scope of the appended claims.

What is claimed is:

1. A method of fabricating an integrated circuit comprising:
   producing a p-well into an uppermost surface of a semiconducting substrate;
   doping a first source dopant region and a first drain dopant region into the uppermost surface of a semiconducting substrate, the first drain and first source dopant regions being lightly doped donor sites;
   doping a combination drain/source dopant region into the uppermost surface of a semiconducting substrate, the first combination drain/source dopant region being a lightly doped donor site;
   doping a gate region, the gate region having a higher concentration of donor sites than either of the dopant regions or the drain/source region;
   depositing polysilicon over the first source dopant region and the first drain dopant region to form emitter polysilicon regions, the emitter polysilicon regions having a higher donor concentration that either of the dopant regions or the drain/source region;
   fabricating an NMOS transistor from the first drain and combination drain/source dopant regions, the NMOS transistor configured to serve as a select transistor in a memory cell;
   fabricating an NMOS transistor from the first source and combination drain/source dopant regions, the NMOS transistor configured to serve as a memory transistor in the memory cell; and
   fabricating bipolar devices in the integrated circuit, the bipolar devices having a breakdown voltage sufficient to withstand a programming voltage of the memory cell.

2. The method of fabricating the integrated circuit of claim 1 wherein the p-well is produced by depositing an epitaxial layer on the uppermost surface of the semiconducting substrate wherein the epitaxial layer is doped so as to have a higher concentration of acceptor sites than the semiconducting substrate.

3. The method of fabricating the integrated circuit of claim 1 wherein the p-well is produced by doping at least a portion of an uppermost surface of the semiconducting substrate so as to have a higher concentration of acceptor sites than the semiconducting substrate.

4. The method of fabricating the integrated circuit of claim 1 further comprising producing collector and emitter regions for at least one NPN transistor from the emitter polysilicon regions.

5. The method of fabricating the integrated circuit of claim 1 further comprising a tunnel diode window, wherein the tunnel diode window is located in proximity to the doped gate region and an oxide in the tunnel diode window is about 7 nanometers in thickness.

6. The method of fabricating the integrated circuit of claim 1 wherein the first source dopant region, the first drain dopant region, the combination drain/source dopant region, and the gate region are all doped to a depth of about 100 nm.

7. A method of fabricating an integrated circuit comprising:
   producing a p-well into an uppermost surface of a semiconducting substrate, the p-well being produced by depositing an epitaxial layer on the uppermost surface of the semiconducting substrate, the epitaxial layer is doped so as to have a higher concentration of acceptor sites than the semiconducting substrate;
   doping a first source dopant region and a first drain dopant region into the p-well, the first drain and first source dopant regions being lightly doped donor sites;
   doping a combination drain/source dopant region into the p-well, the first combination drain/source dopant region being a lightly doped donor site;
   doping a gate region, the gate region having a higher concentration of donor sites than either of the dopant regions or the drain/source region;
   depositing polysilicon over the first source dopant region and the first drain dopant region to form emitter polysilicon regions, the emitter polysilicon regions having a higher donor concentration that either of the dopant regions or the drain/source region;
   fabricating an NMOS transistor from the first drain and combination drain/source dopant regions, the NMOS transistor configured to serve as a select transistor in a memory cell;
   fabricating an NMOS transistor from the first source and combination drain/source dopant regions, the NMOS transistor configured to serve as a memory transistor in the memory cell; and
   producing an emitter region for at least one NPN transistor from the emitter polysilicon regions.

8. The method of fabricating the integrated circuit of claim 7 wherein the first source dopant region, the first drain dopant region, the combination drain/source dopant region, and the gate region are all doped to a depth of about 100 nm.

9. A method of fabricating an integrated circuit comprising:
   producing a p-well into an uppermost surface of a semiconducting substrate, the p-well being produced by doping at least a portion of an uppermost surface of the semiconducting substrate so as to have a higher concentration of acceptor sites than the semiconducting substrate;
   doping a first source dopant region and a first drain dopant region into the uppermost surface of a semiconducting substrate, the first drain and first source dopant regions being lightly doped donor sites;
   doping a combination drain/source dopant region into the uppermost surface of a semiconducting substrate, the first combination drain/source dopant region being a lightly doped donor site;
   doping a gate region, the gate region having a higher concentration of donor sites than either of the dopant regions or the drain/source region;
   depositing polysilicon over the first source dopant region and the first drain dopant region to form emitter polysilicon regions, the emitter polysilicon regions having a higher donor concentration that either of the dopant regions or the drain/source region;
   fabricating an NMOS transistor from the first drain and combination drain/source dopant regions, the NMOS transistor configured to serve as a select transistor in a memory cell;
   fabricating an NMOS transistor from the first source and combination drain/source dopant regions, the NMOS transistor configured to serve as a memory transistor in the memory cell; and
   producing an emitter region for at least one NPN transistor from the emitter polysilicon regions.

10. The method of fabricating the integrated circuit of claim 9 wherein the first source dopant region, the first drain dopant region, the combination drain/source dopant region, and the gate region are all formed to a depth of about 100 nm.

* * * * *

UNITED STATES PATENT AND TRADEMARK OFFICE
CERTIFICATE OF CORRECTION

PATENT NO. : 6,875,648 B1  
APPLICATION NO. : 10/888742  
DATED : April 5, 2005  
INVENTOR(S) : Muhammad I. Chaudhry Page 1 of 1

It is certified that error appears in the above-identified patent and that said Letters Patent is hereby corrected as shown below:

Item 57, on Title Page, Abstract, at line 3:
"… The wells are fabricated to" should read:

-- … The source/drain regions are fabricated to --

Signed and Sealed this

Ninth Day of January, 2007

JON W. DUDAS  
*Director of the United States Patent and Trademark Office*